(12) United States Patent
Irion et al.

(10) Patent No.: US 7,817,978 B2
(45) Date of Patent: Oct. 19, 2010

(54) METHOD FOR ELIMINATING INTERFERENCE IN MEASURING SIGNALS

(75) Inventors: Hans Irion, Winnenden (DE); Bjoern Haase, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 351 days.

(21) Appl. No.: 11/857,930

(22) Filed: Sep. 19, 2007

(65) Prior Publication Data

US 2008/0068001 A1    Mar. 20, 2008

Related U.S. Application Data

(62) Division of application No. 10/503,860, filed on Aug. 6, 2004, now Pat. No. 7,403,759.

(51) Int. Cl.
*H04B 1/10* (2006.01)

(52) U.S. Cl. .............. 455/296; 455/245.1; 455/250.1; 455/345; 455/96

(58) Field of Classification Search .............. 455/245.1, 455/296, 250.1, 345, 26, 27, 98
See application file for complete search history.

(56) References Cited

U.S. PATENT DOCUMENTS

| | | | | |
|---|---|---|---|---|
| 4,392,138 A | * | 7/1983 | Jasper et al. | 342/389 |
| 4,525,685 A | * | 6/1985 | Hesselberth et al. | 331/10 |
| 5,420,889 A | * | 5/1995 | Juntti | 375/346 |
| 5,586,192 A | * | 12/1996 | De Bijl et al. | 381/94.8 |
| 5,694,437 A | * | 12/1997 | Yang et al. | 375/346 |

* cited by examiner

*Primary Examiner*—Nay A Maung
*Assistant Examiner*—Richard Chan
(74) *Attorney, Agent, or Firm*—Michael J. Striker

(57) ABSTRACT

The present invention concerns a method for eliminating interference in measuring signals ($S_M$) which are corrupted by pulsed interference signals ($S_{ST}$) having a known or determinable interference pulse interval ($T_{St}$), whereby the detection period ($\Delta t_E$) of an individual measured value (E) is shorter than an interference pulse period ($\Delta t_{St}$), and a plurality of individual measured values (E) is detected at freely selectable time intervals ($T_E$) of the measuring signal ($S_M$). A reliable elimination of interferences caused by radio-interference sources transmitting in a pulsed manner is achieved by detecting at least three consecutive individual measured values (E) at time intervals ($T_E$) that differ from the interference pulse interval ($T_{St}$), and by determining an interference-filtered measured quantity (M) with the at least three individual measured values (E).

2 Claims, 2 Drawing Sheets

METHOD FOR ELIMINATING INTERFERENCE IN MEASURING SIGNALS

CROSS-REFERENCE

This application is a division of U.S. patent application Ser. No. 10/503,860 filed on Aug. 6, 2004 now U.S. Pat. No. 7,403,759. The invention described and claimed in the present application claims the benefit of priority from said U.S. patent application Ser. No. 10/503,860 under 35 USC 120.

The invention described and claimed hereinbelow is also described in PCT/DE 03/01521, filed May 12, 2003 and DE 102 33 835.3, filed Jul. 25, 2002. This German Patent Application, provides the basis for a claim of priority of invention under 35 U.S.C.119 (a)-(d).

BACKGROUND OF THE INVENTION

The present invention concerns a method for eliminating interference in measuring signals which are corrupted by pulsed interference signals having a known or determinable interference pulse interval, whereby the detection period of an individual measured value is shorter than one interference pulse period, and a plurality of individual measured values is detected at freely selectable time intervals of the measuring signal.

The approach usually taken when external sources of interference are present, i.e., to shield the affected lines, sensors or circuit parts, is frequently associated with considerable costs and is often ineffective, in particular when magnetic coupling occurs. Frequently, shielding cannot be realized, due to the principle involved. This is the case, for example, with capacitance-based positioning devices, e.g., to locate dielectric inclusions in construction materials (also referred to occasionally as stud finders). In this case, the plates of the precision capacitor of the sensor cannot be shielded, due to the principle involved. Positioning devices of this type that are particularly susceptible to interference are described in publications WO 02/14847 A1 and DE 199 15 016 C2, for example.

Other devices that are also particularly susceptible to interference are radar devices, radio devices and other applications, with which high-frequency interferences cannot be shielded, due to the principle involved.

A further, often-used method which results in interference reduction using averaging often results in unacceptably long measurement times. The interference amplitude drops only with the square root of the measurement time.

If a utilized working frequency of the measuring system is in the GHz range, e.g., between 1 and 3 GHz, there is considerable potential for interference by various mobile communication applications, e.g., by applications based on the DECT, GSM and Bluetooth standards. Radio-interference sources of this type, which function according to "TDMA" technology, transmit pulsed interference signals at periodic intervals (frames) only for a short period (time slots), the interference signals resulting in a periodic interference of the received measuring signal.

Measuring devices which do not operate in the GHz range are often also influenced, however. For example, non-linear characteristic curves of electronic components in measurement circuits in combination with high transmitting power of cellular telephones, for example, also cause interference in circuits which actually operate only in the low-frequency range. The method according to the present invention results in success in these cases as well.

In general, the effects of pulsed sources of interference are observed in diverse types of measuring devices in which weak electrical measured quantities are detected. The corruption of measuring signals can be caused by electromagnetic interference, in particular, which can occur in measurement sensors and evaluation circuits, for example.

The present invention is based on the object of providing a method of the type mentioned in the preamble, with which interference is eliminated as effectively as possible from a measuring signal disturbed by a pulsed, periodic interference signal.

SUMMARY OF THE INVENTION

Accordingly, it is provided that at least three consecutive individual measured values are detected at time intervals that differ from the interference pulse interval and an interference-filtered measured quantity is determined or, as an alternative, it is determined whether an interference signal is present, and the measuring signal is detected when the interference signal is not present.

With these features, disturbed individual measured values are suppressed, and only individual measured values that are at least substantially non-disturbed are used to derive the measured quantity, so that a measured quantity is obtained that is unimpaired by the radio-interference source transmitting in a pulsed manner. The elimination of interference according to the present invention succeeds without the use of shielding measures, does not require long measurement times, and enables complete elimination of interference for a broad class of potential sources of interference.

To eliminate interference, it is advantageous if the time intervals of the individual measurements from which the interference-filtered signal is determined are constant, and the individual measurements are therefore recorded with an unvarying period duration.

Interference elimination with particularly little complexity is achieved when the time intervals of the individual measurements are selected such that a maximum of one measured value out of three consecutive measured values is faulty. In general, the single disturbed measured value will differ greatly from the two non-disturbed measured values. When calculating the median of three consecutive measured values, one of the two non-disturbed measured values is most certainly obtained. The method for determining the median is not limited to the use of three individual measured values; instead, it can be easily expanded to include more than three individual measurements.

According to a further advantageous procedure, it is determined which of the individual measured value(s) differs most from the other—in fact, from more than half of the other—individual measured values, and the measured quantity is determined with the mean of the other individual measured values.

An interference by various radio-interference sources having a different interference pulse period and/or a different interference pulse interval can be eliminated in a simple manner by selecting the period duration such that at least two different interference signals having different interference pulse intervals are eliminated from the measuring signal simultaneously.

For example, to detect the operation of a radio-interference source before eliminating the interference, it can be advantageously provided that, to distinguish between corrupted and non-corrupted measuring signals, the measuring signals are detected continuously and the first or a higher derivation of the amplitudes of the measuring signal is calculated over time. As an alternative, the first or a higher derivation of a function of the amplitude of the measuring signal can be used in the evaluation, e.g., the square of its absolute amount.

BRIEF DESCRIPTION OF THE DRAWINGS

The present invention will be explained in greater detail hereinbelow based on an exemplary embodiment, with reference to the drawing.

DETAILED DESCRIPTION OF THE EXEMPLARY EMBODIMENT

As discussed hereinabove, those applications are affected by radio interference in particular with which adequate shielding cannot be realized, due to the principle involved. This is the case with positioning devices for locating objects hidden in construction materials, for example. A plate capacitor is used there as the sensor, the stray field of which penetrates the construction material. Changes in the dielectric medium in the region of the stray field of the sensor capacitor cause a change in the capacitance, and this can be measured electrically. In an advantageous manner, this change in capacitance is measured such that an electrical resonant circuit is created which contains the sensor capacitor. The capacitance of the sensor capacitor and, therefore, objects hidden in the construction material, can be determined based on the decay characteristic after excitation of the resonant circuit.

Figure 1:
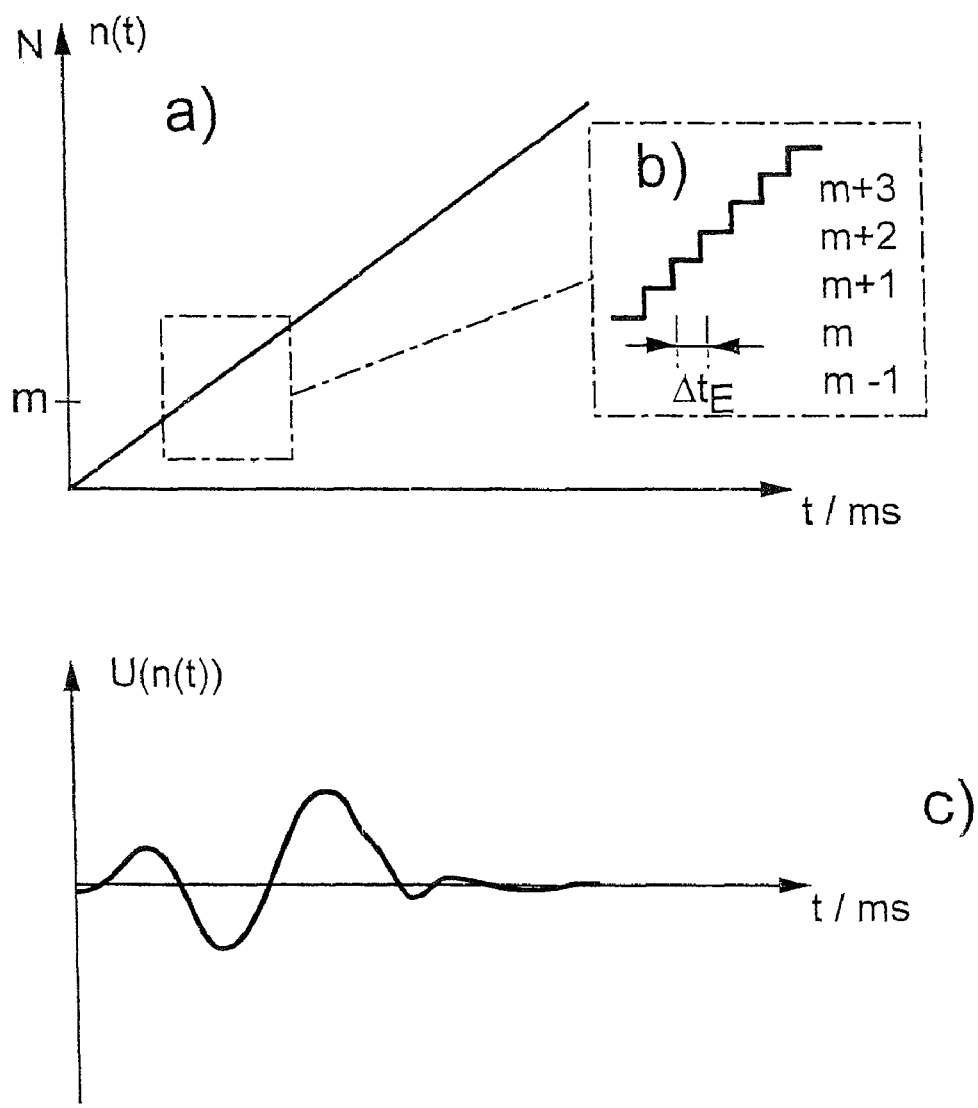
FIGS. 1 a, b, c show a schematic representation for determining a voltage signal by sampling a measuring signal that is present, and FIGS. 2 a, b, c show a schematic representation for obtaining detected values and deriving an interference-filtered measured quantity.

Since the capacitance of suitable sensor capacitors is very small, high natural frequencies are obtained in practice which can absolutely have a magnitude of 1 to 3 GHz. The measured sensor signals, as measuring signals on the input side, are therefore at risk of being disturbed by mobile telecommunication applications. As shown in FIG. 1, the decay behavior of a resonant circuit can be measured in the GHz range using synchronous sampling, in which, e.g., a voltage $U_{HF}(t)$ present at the precision capacitor is determined at various points in time $t_{HF}(n)$ $$t_{HF}(n) = n \times \Delta t_{HF}$$

at a time interval $\Delta t_{HF}$ and associated time index n after excitation of the resonant circuit at point in time $t_{HF}(0)=0$. Given oscillation frequencies in the range of 2 GHz, the time interval and/or spacing $\Delta t_{HF}$ is advantageously in the magnitude of 50 ps, for example. (Notable here is the differentiation of $\Delta t_{HF}$ from time increments $\Delta t_E$ having a magnitude of 100 microseconds defined later in conjunction with the explanation of detected values E.) For a given time index and/or sampling index n and the associated points in time $t_{HF}(n)$ after excitation of the resonant circuit, voltage $U_{HF}(t_{HF}(n))$ can be sampled and stored in a "sample-and-hold" mechanism, for example, at the output of which the voltage signal U(n) discussed hereinbelow is located.

A single sampling can be carried out to determine voltage signal U(n). It is also possible, as an alternative, to excite the resonant circuit repeatedly, e.g., with repeating frequencies in the MHz range and averaging of the particular voltage signal U(n) located after the sample-and-hold mechanism. This procedure is particularly advantageous for determining noise when a sufficiently long time interval $\Delta t_E$ is available for detecting a single voltage signal value U(n) and/or for an individual measured value E.

Sampling circuits of this type are known per se in the context of oscilloscopes, for example. The sampling indices n can be preselected using digital electronics, for example. FIG. 1a shows a time ramp for the sampling procedure, and FIG. 1b shows an enlarged section thereof with steps m.

If the measurement of the voltage signal U(n) is carried out when pulsed interferences are present, the associated individual measured values E and, therefore, a measured quantity E derived therefrom, are potentially corrupted.

In the present example, sampling index n is increased by 1 each time at time intervals $\Delta t_E$ having a magnitude of, e.g., 100 microseconds, until a maximum value N is reached. If counting index n was zero at point in time t=0, the time dependence $$n(t) = n \times \Delta t_E$$

is obtained for n and, therefore, a signal U(t) that varies over time that follows the change in the sampling indices n (refer to FIG. 1) is obtained for the sampled measuring signal U(n)=U(n(t)). The consequence is that a measuring signal $U_{HF}$—which describes the decay behavior of a resonant circuit in the example—that was originally located in the high frequency range can be depicted sequentially on a measuring signal in the audio-frequency range U(n(t)) using synchronous sampling.

It is feasible that just one measured value E is enough for the statement desired for the positioning device, e.g., a voltage signal U(m) for a fixed, specified index m (in the ordinate direction). It is further feasible that individual measured values E are obtained in another manner, e.g., via frequency conversion.

In the exemplary embodiment it is possible to repeat the measurement of the potentially disturbed quantity U(n) any number of times. In the example illustrated in FIG. 2, U(m) is measured periodically for a given index m, each time with a time interval $T_E$.

The influence of a pulsed radio-interference source on the individual measurements of U(m) is shown in FIG. 2b. The individual measured values associated with index m are labeled E1, E2 and E3. During three time windows having the particular length and/or interference pulse period $\Delta t_{ST}$, interference is superposed on measured signals U(n). Over the course of U(n(t)) and/or U(t) shown (FIG. 2b), this interference can be recognized in the form of strong noise. In the case shown in FIG. 2b, each of these interferences repeats periodically with a time interval and/or interference pulse interval $T_{ST}$. The property of a fixed interference pulse duration $\Delta t_{St}$ and a fixed interference repeat rate with interference pulse interval $T_{St}$ are characteristic of various mobile telecommunication applications that function according to the TDMA (Time Division Multiple Access) method and generate interference pulses with a period pulse interval at period intervals (frames) for a short period of time (time slots). In FIG. 2b, it is clear that, of the three consecutive measurements of U(m), only the second individual measured value E2 is corrupted with an interference. The duration of interference pulse $\Delta T_{ST}$ is markedly longer than duration $\Delta t_E$, which is available for detecting individual measured value E.

The details regarding obtaining measured signals $S_M$ will be considered in abstraction hereinbelow, since it is not relevant for the method principle for eliminating interference. The essential point is that individual measured values E—which potentially have interference—of a measuring signal $S_M$ are detected, and time intervals $T_E$ between these individual measured values E are selected in a suitable manner.

Figure 2:
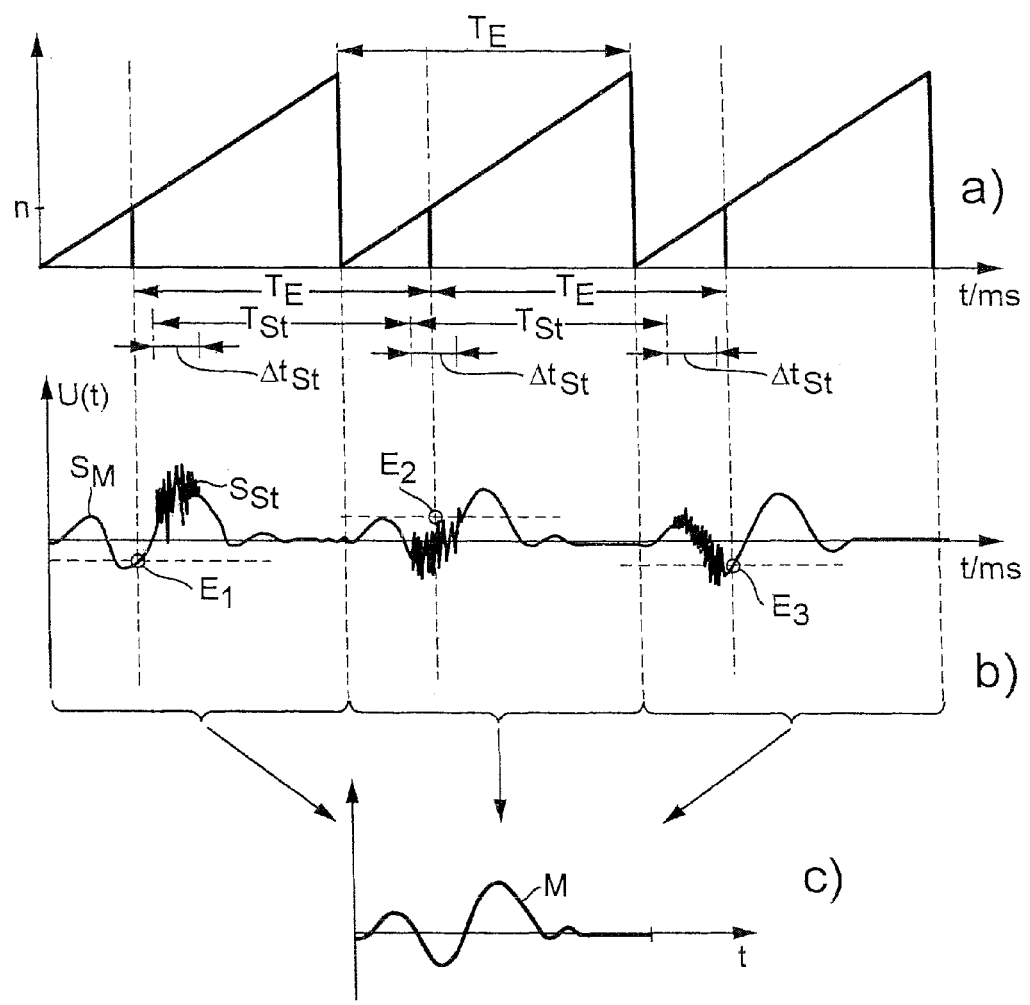

It is also essential here that individual measured value E, as shown in FIG. 2, can have an interference signal $S_{St}$ from a pulsed radio-interference source superposed on it due to the recorded measuring signal $S_M$ being acted upon at the input of the measuring system, so that individual measured value E—the second individual measured value $E_2$ in FIG. 2—is considerably corrupted. Radio-interference sources of this type result from various mobile telecommunication applications in particular, e.g., based on the DECT standard, from the GSM network or Bluetooth, which operate according to the TDMA (Time Division Multiple Access) method and emit interference pulses with a periodic pulse interval $T_{St}$ at periodic intervals (frames) for a short period of time (time slots). The duration of interference pulse $\Delta t_{St}$ is markedly longer than detection period $\Delta t_E$ of individual measured value E, so that the signals used to derive individual measured value E get lost in the noise of interference signal $S_{St}$.

As further shown in FIG. 2, to eliminate interferences caused by pulsed interference signals of this type, at least two further measurements are carried out to detect individual measured values E at the corresponding time positions of recorded measuring signal $S_M$, whereby time intervals $T_E$ of the further detections are selected such that they differ from interference pulse interval $T_{St}$.

This ensures that, out of three detections of individual measured values E, for example, at least two individual measured values E, i.e., more than half of the individual measured values E, occur in the intervals of interference signal $S_{St}$ and are therefore do not have interference pulses superposed on them.

In a further procedure, a suitable evaluation of individual measured values E is carried out, e.g., a distinction is made as to which of the individual measured value(s) E differ significantly from the other. This/these individual measured value(s) E are discarded in the further evaluation, and the mean of the other individual measured values E, which form the majority, is calculated. The interference-filtered measuring quantity M is then obtained from the individual measured value that results (refer to FIG. 2c). According to an advantageous alternative evaluation, the mean of the individual measured values E is calculated, based on which measured quantity M is obtained in a very simple and reliable manner.

Preferably, the time interval for detecting individual measured values E is selected with a fixed period duration $T_E$ and is adapted in a suitable manner to the intervals and/or gaps in interference signal $S_{St}$. This results in various possible time windows that can also be advantageously selected such that the interference elimination described is effective at various common pulsed radio-interference sources with different interference pulse duration $\Delta t_{St}$ and/or with different interference pulse interval $T_{St}$. For an interference by DECT and/or GSM mobile telephones, a suitable period duration $T_E$ for detecting individual measured values E (time window) is between 10417 μs and 11249 μs, whereby the middle of this time window is 10833 μs. Further time windows are listed in the following table:

| Service | Possible measuring intervals |
| --- | --- |
| GSM | 577 μs-2.01 ms |
|  | 2.59 ms-4.04 ms |
|  | 5.19 ms-6.63 ms |
|  | 9.807 ms-11.249 ms |

-continued

| Service | Possible measuring intervals |
| --- | --- |
| DECT | 417 μs-4.79 ms |
|  | 5.21 ms-9.58 ms |
|  | 10.42 ms-14.79 ms |
| Bluetooth HV2 | 625 μs-938 ms |
|  | 1.56 ms-1.87 ms |
|  | 3.13 ms-3.43 ms |
|  | 4.07 ms-4.37 ms |
|  | 5.63 ms-5.94 ms |
| Bluetooth HV3 | 625 μs-1.56 ms |
|  | 2.19 ms-3.12 ms |
|  | 4.37 ms-5.31 ms |

A further possibility is the adaptive adjustment of time intervals $T_E$ (measurement intervals) for detecting individual measured values E. To accomplish this, interference pulse interval $T_{St}$ and interference pulse duration $\Delta t_{St}$ would have to be determined via corresponding programming of the measurement system, for example. Although the procedure is flexible, it is relatively complex.

According to a further possibility for eliminating interference that is similar to that described hereinabove, it is first determined whether an interference signal is present, and measuring signal $S_M$ and/or individual measured values E are then recorded if an interference signal is not present.

To determine whether an interference caused by a radio-interference source transmitting in a pulsed manner is present, one advantageous possibility is to calculate, over time, the first or a higher derivative of the received measuring signal $S_M$ or a suitable conversion variable thereof, in particular the sum of squares of the amplitudes. Radio-interference sources of the type indicated hereinabove result in changes in the measuring signal with relative steep flanks which can be reliably detected via the derivation, compared to the relatively flat changes in the measuring signal that occur as a result of a relative position change between the measured object and the measuring device in a searching procedure, for example. With an upstream detection of this type, the operation of a radio-interference source can be reliably detected, so that this information can be taken into account in the evaluation.

What is claimed is:

1. A method for eliminating interference in measuring signals which are corrupted by pulsed interference signals, comprising the steps of:
    providing the measuring signals having a known or determinable interference pulse interval;
    selecting the detection period of an individual measured value shorter than an interference pulse period;
    detecting a plurality of individual measured values at freely selectable time intervals of the measuring signal, including detecting at least three consecutive individual measured values at time intervals that differ from the interference pulse interval; and
    determining an interference-filtered measured quantity with the at least three individual measured values, wherein the measured quantity is determined based on a median of the at least three individual measured values.

2. The method as recited in claim 1, further comprising providing the time intervals to be constant, and detecting the individual measured values with a fixed period duration.

* * * * *